(12) United States Patent
Cai

(10) Patent No.: US 12,035,566 B2
(45) Date of Patent: Jul. 9, 2024

(54) DISPLAY PANEL AND DISPLAY DEVICE

(71) Applicant: WUHAN TIANMA MICROELECTRONICS CO., LTD., Wuhan (CN)

(72) Inventor: Yu Cai, Wuhan (CN)

(73) Assignee: WUHAN TIANMA MICROELECTRONICS CO., LTD., Wuhan (CN)

(*) Notice: Subject to any disclaimer, the term of this patent is extended or adjusted under 35 U.S.C. 154(b) by 416 days.

(21) Appl. No.: 17/537,207

(22) Filed: Nov. 29, 2021

(65) Prior Publication Data

US 2022/0085337 A1 Mar. 17, 2022

(30) Foreign Application Priority Data

Aug. 6, 2021 (CN) .......................... 202110901709.9

(51) Int. Cl.
*H10K 50/858* (2023.01)
*H10K 59/12* (2023.01)

(52) U.S. Cl.
CPC ........... *H10K 50/858* (2023.02); *H10K 59/12* (2023.02)

(58) Field of Classification Search
CPC .............................. H10K 50/858; H10K 59/12
USPC ......................................................... 313/506
See application file for complete search history.

(56) References Cited

U.S. PATENT DOCUMENTS

| 2017/0148855 A1* | 5/2017 | Kaji ..................... H10K 50/125 |
| 2017/0243525 A1* | 8/2017 | Morikawa ............ H10K 50/844 |
| 2022/0005893 A1* | 1/2022 | Liu ...................... H10K 59/122 |
| 2022/0140007 A1* | 5/2022 | Yan ........................ H10K 59/38 257/89 |
| 2023/0105154 A1* | 4/2023 | Sun ........................ H10K 71/00 257/40 |

FOREIGN PATENT DOCUMENTS

| CN | 209912873 U | 1/2020 |
| CN | 111128010 A | 5/2020 |
| CN | 112310322 A | 2/2021 |

OTHER PUBLICATIONS

Chinese Office Action mailed Sep. 6, 2023, issued in related Chinese Application No. 2021109017099, 10 pages.

* cited by examiner

*Primary Examiner* — Christopher M Raabe
(74) *Attorney, Agent, or Firm* — CHRISTENSEN O'CONNOR JOHNSON KINDNESS PLLC

(57) ABSTRACT

A display panel and a display device are provided. The display panel includes light-emitting units located in a display region and on a side of a substrate, an organic layer located in the display region and on a side of the light-emitting units facing away from the substrate, and a carrier layer located in the display region and between the organic layer and the light-emitting units and in contact with the organic layer. The display region includes a first display region and a second display region located between the first display region and the non-display region. The carrier layer includes at least one first groove in the second display region. A projection of the organic layer on the carrier layer covers the at least one first groove. The at least one first groove overlaps with none of the light-emitting units in a normal direction of the substrate.

20 Claims, 12 Drawing Sheets

DISPLAY PANEL AND DISPLAY DEVICE

CROSS-REFERENCE TO RELATED APPLICATIONS

The present application claims priority to Chinese Patent Application No. 202110901709.9, filed on Aug. 6, 2021, the content of which is incorporated herein by reference in its entirety.

TECHNICAL FIELD

The present disclosure relates to the field of display technologies and, particularly, to a display panel and a display device.

BACKGROUND

With the continuous development of science and technology, more and more display devices are widely used in people's daily life and work and become indispensable. At present, with the continuous development of display technology, consumers' requirements for display devices continue to increase, various displays have appeared, and display technologies such as liquid crystal display and organic light-emitting display have been developed. Moreover, on the basis of the above, technologies such as 3D display, touch display, curved surface display, and ultra-high resolution display are also developing.

However, current display panels have relatively large border due to design of the display area related to the organic layer, which is not beneficial to the trend of narrow border of the display panel.

SUMMARY

In a first aspect, an embodiment of the present disclosure provides a display panel. The display panel includes a substrate having a display region and a non-display region, light-emitting units arranged in the display region and located on a side of the substrate, an organic layer arranged in the display region and located on a side of the light-emitting units facing away from the substrate, and a carrier layer at least partially arranged in the display region and located between the organic layer and the light-emitting units. The carrier layer is in contact with the organic layer. The display region includes a first display region and a second display region, and the second display region is located between the first display region and the non-display region. The carrier layer includes at least one first groove in the second display region. A projection of the organic layer on the carrier layer covers the at least one first groove. The at least one first groove overlaps with none of the light-emitting units in a normal direction of the substrate.

In a second aspect, an embodiment of the present disclosure provides a display device including the above display panel.

BRIEF DESCRIPTION OF DRAWINGS

In order to better illustrate technical solutions of embodiments of the present disclosure, accompanying drawings used in the embodiments are briefly described below. The drawings described below are merely some of the embodiments of the present disclosure. Based on these drawings, those skilled in the art can obtain other drawings.

DESCRIPTION OF EMBODIMENTS

In order to better understand technical solutions of the present disclosure, the embodiments of the present disclosure are described in detail with reference to the drawings.

It should be clear that the described embodiments are merely part of the embodiments of the present disclosure rather than all of the embodiments. Other embodiments obtained by those skilled in the art shall fall into the protection scope of the present disclosure.

The terms used in the embodiments of the present disclosure are merely for the purpose of describing specific embodiments, rather than limiting the present disclosure. The terms "a", "an", "the" and "said" in a singular form in the embodiments of the present disclosure and the attached claims are also intended to include plural forms thereof, unless noted otherwise.

It should be understood that the term "and/or" used in the context of the present disclosure is to describe a correlation relation of related objects, indicating that there can be three relations, e.g., A and/or B can indicate A alone, A and B, and B alone. In addition, the symbol "/" in the context generally indicates that the relation between the objects before and after the "/" is an "or" relation.

It should be understood that although the terms "first" and "second" can be used in the present disclosure to describe the display region, these touch electrodes should not be limited to these terms. These terms are used only to distinguish the different display regions from one another. For example, without departing from the scope of the embodiments of the present disclosure, a first display region can also be referred to as a second display region. Similarly, the second display region can also be referred to as the first display region.

Figure 1:
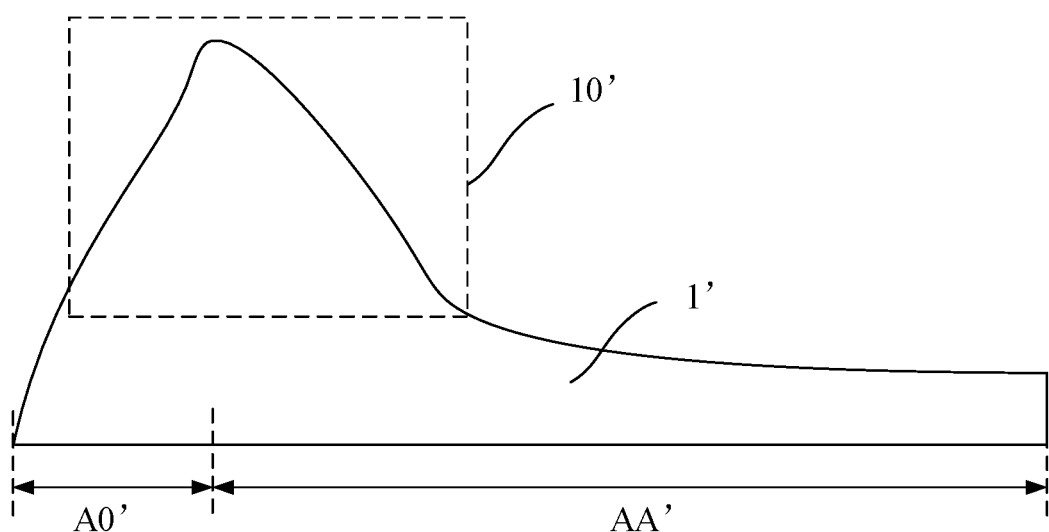
FIG. 1 is a schematic cross-sectional view of an organic layer in a display panel in the related art.

Currently, an organic layer is provided in the display region of the display panel. FIG. 1 is a schematic cross-sectional view of an organic layer in a display panel in the related art. As shown in FIG. 1, an organic layer 1' has a convex structure 10' on an edge of a display region AA'. The convex structure 10' may bring adverse effect to a surface flatness of the organic layer 1', and may also lead to a relative long climbing area A0' (also referred to as a climbing distance). The climbing area A0' is a distance from a lowest point of the organic layer 1' to a highest points of the convex structure 10', making the display panel with a relatively large frame width and thus not being beneficial to a narrow frame design of the display panel.

The organic layer is prone to bulge at its edge. In the manufacturing process of the display panel, the organic layer is generally formed by printing. An ink solution is formed by dissolving the material for forming the organic layer with a solvent, a certain volume of the ink solution is printed in the display region by an inkjet printing device, and then the solvent is removed by a process such as drying to form the organic layer. In this process, the ink solution flows from a printing center to the surrounding spaces and may accumulate at an edge far away from the printing center, which causes the organic layer to form a bulge (shown in FIG. 1) at the edge after drying. Because the bulge is at least partially located at the edge of the display region AA, a difference exists between the light output by the pixels at the edge of the display region AA and the light output by the pixels at a center of the display region AA, thereby causing uneven display of the display panel.

Figure 2:
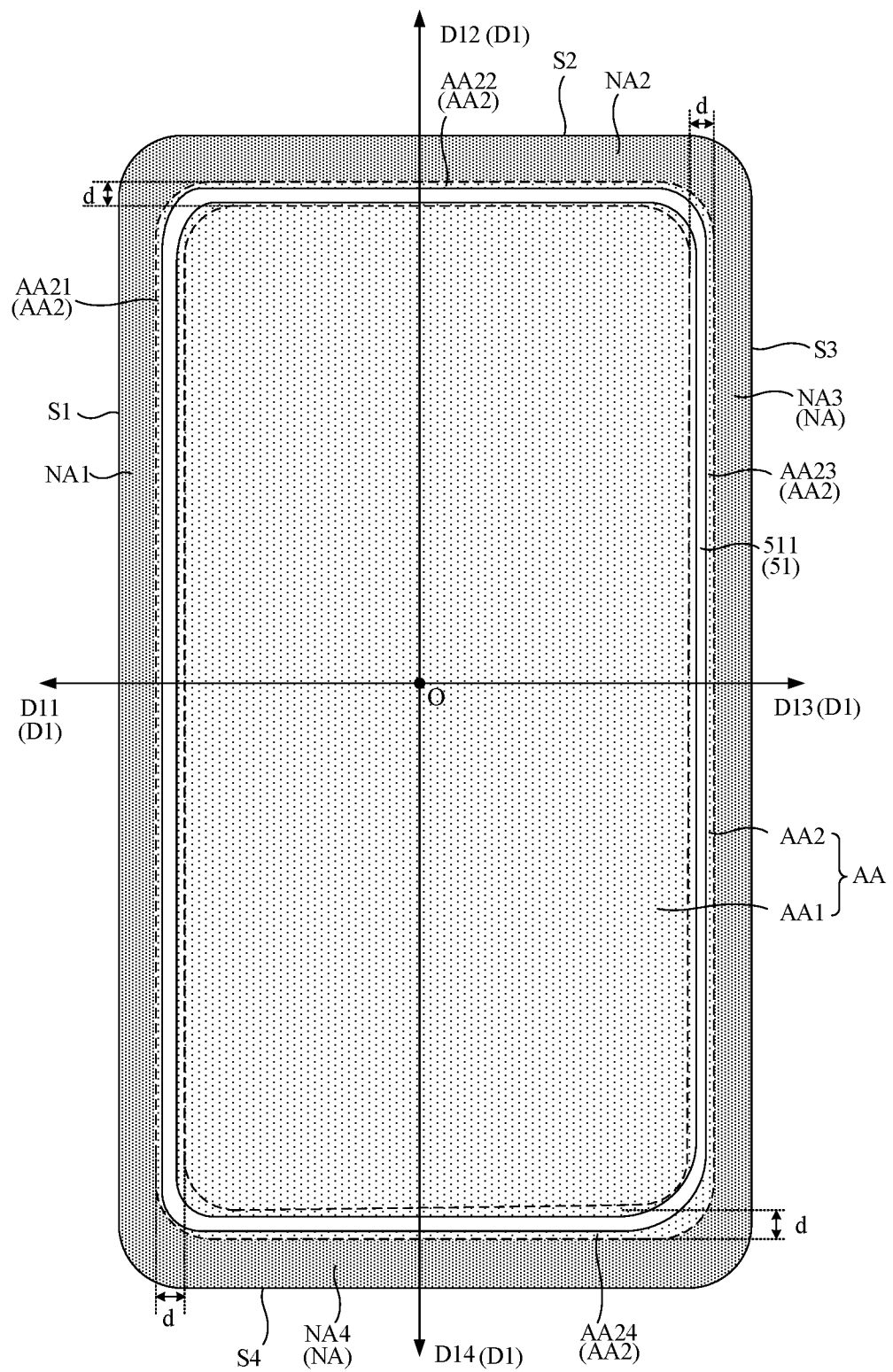
FIG. 2 is a schematic top view of a display panel according to an embodiment of the present disclosure.
Figure 3:
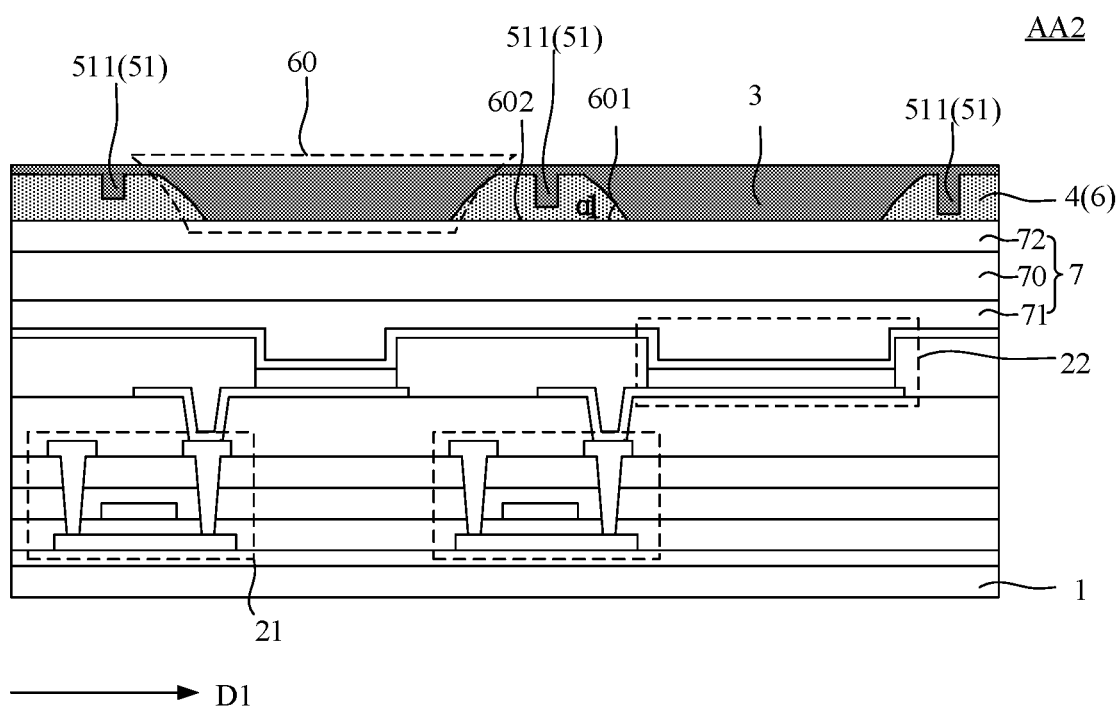
FIG. 3 is a schematic cross-sectional view of a second non-display region shown in FIG. 2.

In view of this, an embodiment of the present disclosure provides a display panel. FIG. 2 is a schematic top view of a display panel according to an embodiment of the present disclosure, and FIG. 3 is a schematic cross-sectional view of a second display region shown in FIG. 2. As shown in FIG. 2 and FIG. 3, the display panel includes a substrate 1. The substrate 1 includes a display region AA and a non-display region NA. The display region AA includes a plurality of sub-pixels, and the sub-pixels each include a pixel driving circuit and a light emitting unit 22 that are electrically connected to each other. The pixel driving circuit includes a plurality of thin film transistors 21. In FIG. 3, only one thin film transistor 21 electrically connected to the light-emitting unit 22 is exemplarily illustrated.

As shown in FIG. 2, the display region AA includes a first display region AA1 and a second display region AA2, where the second display region AA2 is located between the first display region AA1 and the non-display region NA. The second display region AA2 is located at a side of the display region AA close to the non-display region NA. In an embodiment, the second display region AA2 can be an annular area surrounding the first display region AA1. In an embodiment of the present disclosure, the light-emitting units 22 are provided in both the first display region AA1 and the second display region AA2. When the display panel is in operation, each of the first display region AA1 and the second display region AA2 can display images, and the first display region AA1 and the second display region AA2 can display a complete picture together without a boundary therebetween.

The non-display region NA refers to a region of the display panel where no light-emitting unit 22 is provided. Peripheral circuits including a scan driving circuit and a data driving circuit are provided in the non-display region NA. In FIG. 2, the non-display region NA and the display region AA are hatched with different patterns to distinguish them.

In an embodiment of the present disclosure, as shown in FIG. 3, the display panel further includes an organic layer 3 and a carrier layer 4 that are provided in the display region AA. The organic layer 3 is located on a side of the light-emitting unit 22 facing away from the substrate 1. The carrier layer 4 is located between the organic layer 3 and the light emitting unit 22. The carrier layer 4 is in contact with the organic layer 3. The carrier layer 4 serves as a carrier when preparing the organic layer 3. When preparing the display panel, the carrier layer 4 is prepared first, and then the organic layer 3 is prepared on a side of the carrier layer facing away from the substrate 1.

In an embodiment of the present disclosure, as shown in FIG. 3, the carrier layer 4 includes at least one first groove 51 in the second display region AA2, and an orthographic projection of the organic layer 3 on a plane of the carrier layer 4 covers the first groove 51. That is, a part of the organic layer 3 is arranged in the first groove 51. The first groove 51 overlaps with one of the light-emitting units 22 in a normal direction of the substrate 1.

In embodiments of the present disclosure, the first groove 51 is provided in the carrier layer 4 and is arranged in the second display region AA2 where the organic layer 3 is easier to accumulate. When the organic layer 3 is subsequently prepared with a process such as printing, an organic material whose initial state is liquid can flow into the first groove 51 of the carrier layer 4. That is, the first groove 51 is provided to accommodate at least part of the organic material, so as to prevent the formed organic layer 3 from accumulating at certain positions to generate bulges, thereby improving the flatness of a surface of the organic layer 3 facing away from the carrier layer 4. With such configuration, a length of a climbing region of the organic layer 3 in the non-display region NA is also decreased, which can reduce the frame width of the display panel.

As shown in FIGS. 2 and 3, in an embodiment of the present disclosure, the second display region AA2 is adjacent to the non-display region NA.

As shown in a sample embodiment of FIG. 2, a width d of the second display region AA2 satisfies 7 mm≤d≤8 mm, and a width direction of the second display region AA2 at any position is a direction from a center of the display region AA towards the non-display region NA closest to the second display region AA2 located at this position. The width direction of the second display region AA2 is defined as the first direction D1 in the following description. According to the difference in the relative positional relationship between the second display region AA2 and the first display region AA1, the first direction D1 can include a plurality of different directions.

As shown in FIG. 2, when the display panel is quadrangular (rectangular), the non-display region NA includes a first non-display sub-region NA1 close to a first edge S1 of the display panel, a second non-display sub-region NA2 close to a second edge S2 of the display panel, a third non-display sub-region NA3 close to a third edge S3 of the display panel, and a fourth non-display sub-region NA4 close to a fourth edge S4 of the display panel.

The second display region AA2 includes a first display sub-region AA21, a second display sub-region AA22, a third display sub-region AA23, and a fourth display sub-region AA24. The first display sub-region AA21 is located between the first non-display sub-region NA1 and the first display region AA1. The second display sub-region AA22 is located between the second non-display sub-region NA2 and the first display region AA1. The third display sub-region AA23 is located between the third non-display sub-region NA3 and the first display region AA1. The fourth display sub-region AA24 is located between the fourth non-display sub-region NA4 and the first display region AA1.

The first direction D1 includes a first sub-direction D11, a second sub-direction D12, a third sub-direction D13, and a fourth sub-direction D14. The first sub-direction D11 is a direction from a center O of the display region AA to the first non-display sub-region NA1 The first sub-direction D11 is a width direction of the first display sub-region AA21. The second sub-direction D12 is a direction from the center O of the display region AA to the second non-display sub-region NA2. The second sub-direction D12 is a width direction of the second display sub-region AA22. The third sub-direction D13 is a direction from the center O of the display region AA to the third non-display sub-region NA3. The third sub-direction D13 is a width direction of the third display sub-region AA23. The fourth sub-direction D14 is a direction from the center O of the display region AA to the fourth non-display sub-region NA4. The fourth sub-direction D14 is a width direction of the fourth display sub-region AA24.

In embodiments of the present disclosure, the second display region AA2 is defined as a region where the first groove 51 is located. A width of the second display region AA2 is a width of the region where the first groove 51 is located. That is, the width d of the second display region AA2 can be understood as the distance from a side of the first groove 51 close to the first display region AA1 to a side of the first groove 51 close to the non-display region NA.

In embodiments of the present disclosure, the positions, structures, and materials of the carrier layer 4 and the organic layer 3 in the display panel can be implemented in various ways and are exemplarily illustrated below.

As shown in FIG. 3, in an embodiment of the present disclosure, the carrier layer 4 can be used as the light extraction layer 6 for adjusting the propagation direction of light. In an embodiment of the present disclosure, a refractive index of the carrying layer 4 can be smaller than a refractive index of the organic layer 3, and a plurality of openings 60 corresponding to the light-emitting units 22 can be provided in the light extraction layer 6.

As shown in FIG. 3, the light extraction layer 6 further includes a first side surface 601 and a first bottom surface 602. The first side surface 601 is configured for forming the openings 60, and the first bottom surface 602 intersects the first side surface 601 and faces towards the substrate 1. An angle $\alpha_1$ formed between the first side surface 601 and the first bottom surface 602 satisfies $0<\alpha_1<90°$. The organic layer 3 fills the opening 60 and is in contact with the first side surface 601. The first side surface 601 is configured to adjust the light having large angle of view emitted by a corresponding light-emitting unit 22 into a light having small angle of view.

Figure 4:
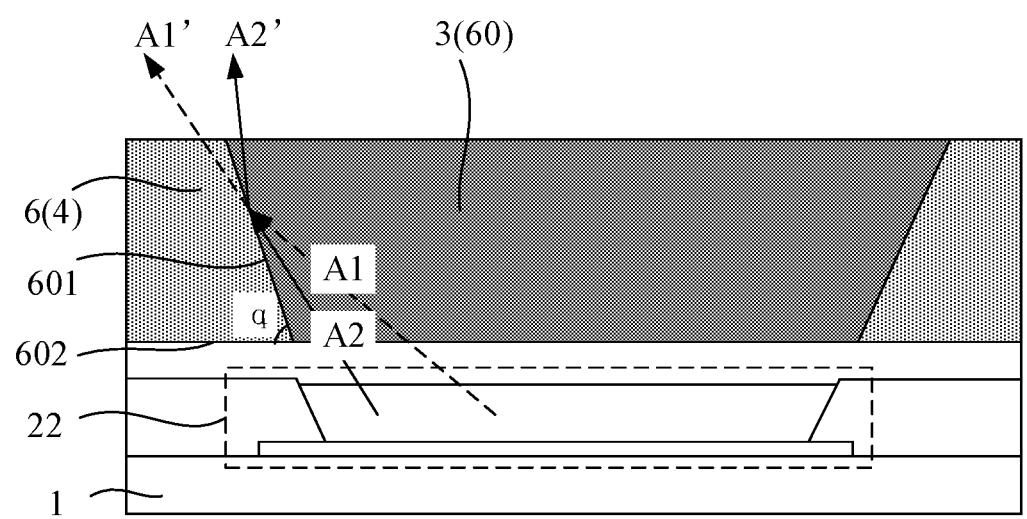
FIG. 4 is a schematic diagram of a light path of light having large angle of view propagating through a first side surface of a light extraction layer according to an embodiment of the present disclosure.

FIG. 4 is a schematic diagram of a light path of a light having large angle of view propagating through the first side surface 601 of the light extraction layer 6 in an embodiment of the present disclosure. As shown in FIG. 4, for the light having large angle of view A1 emitted by the light emitting unit 22, the light A1 is refracted after being incident to the first side surface 601. Compared with the incident light A1, the refracted light A1 has a propagating direction deflecting towards the normal direction of the display panel. For the light having large angle of view A2, after the light A2 is incident to the first side surface 601, since an incident angle of the light A2 is larger and meets the condition of total reflection, this part of the light can be totally reflected. Compared with the incident light A2, the totally reflected light A2' has a propagating direction deflecting toward the normal direction of the display panel.

It some embodiments of the present disclosure, the light extraction layer 6 and the organic layer 3 are provided, and the materials, profiles and positions of the light extraction layer 6 and the organic layer 3 are matched, so that the entirety including the light extraction layer 6 and the organic layer 3 can be used as a micro lens pattern (MLP). The micro lens pattern can adjust the light emitted by the light-emitting unit 22 and originally propagating along a large-angle direction to propagate along a small-angle direction, which can improve the light extraction efficiency of the light-emitting unit 22 and can increase the light output brightness of the display panel in a direction of a front viewing angle.

In an embodiment, as shown in FIG. 3, the opening 60 and the first groove 51 do not overlap in the normal direction of the substrate 1. With such configuration, the light output efficiency of the display panel is increased while the first groove 51 provided in the surface of the light extraction layer 6 can also be used to ensure the flatness of the organic layer 3, which improve the display uniformity of the display panel, reduce a climbing distance from the lowest point to the highest point of the organic layer 3, and narrows a frame width of the display panel.

In an embodiment, as shown in FIG. 3, the first groove 51 is located between two adjacent openings 60.

When preparing the display panel with the structure shown in FIG. 3, after forming the light-emitting units 22, firstly, the light extraction layer 6 is formed with a material having a relatively small refractive index. The light extraction layer 6 includes the opening 60 and the first groove 51. The opening 60 and the first groove 51 can be formed in the same process. In an embodiment of the present disclosure, a half-gray-scale mask can be used to expose the light extraction layer 6 to obtain openings 60 and first grooves 51 with different depths. Regions with different transmittances in the half-gray-scale mask are used to form openings 60 and first grooves 51, respectively. After the preparation of the light extraction layer 6 is completed, in an embodiment, the organic layer 3 is formed with a material with a relatively large refractive index on the side of the light extraction layer 6 facing away from the substrate 1. The organic layer 3 fills the opening 60 and the first groove 51. The preparation of the organic layer 3 can be formed by a process such as inkjet printing.

In an embodiment, as shown in FIG. 3, an encapsulation layer 7 can also be provided between the light extraction layer 6 and the light-emitting unit 22. In an embodiment, the encapsulation layer 7 includes a first inorganic encapsulation layer 71, a second inorganic encapsulation layer 72, and an organic encapsulation layer 70 located between the first inorganic encapsulation layer 71 and the second inorganic encapsulation layer 72. The organic encapsulation layer 70 can be formed by an inkjet printing process.

In an embodiment, when the carrier layer 4 is used as the light extraction layer 6 and the refractive index of the organic layer 3 is greater than a refractive index of the light extraction layer 6, the openings 60 can be arranged in the first display region AA1 and the second display region AA2, so that the brightness of the emitted light from the front viewing angle direction of the first display region AA1 and the second display region AA2.

In an embodiment, the first groove 51 can be provided only in the second display region AA2. In the first display region AA1, the first groove 51 may not be provided in the light extraction layer 6. That is, in the first display region AA1, a surface of the carrier layer 4 located between two adjacent openings 60 is a flat surface.

Figure 5:
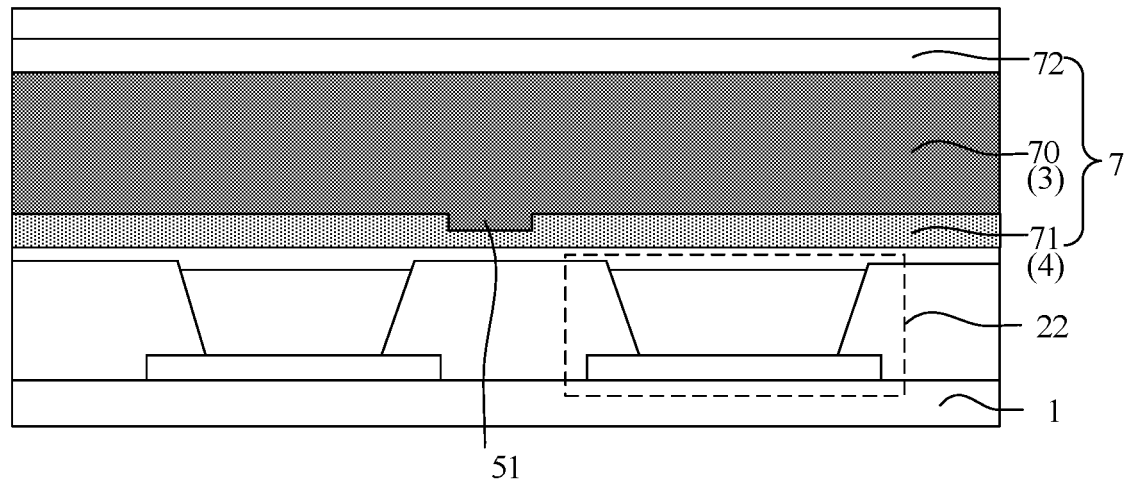
FIG. 5 is another schematic cross-sectional view of a second non-display region according to an embodiment of the present disclosure.

In an embodiment, the carrier layer 4 and the organic layer 3 can be used as an encapsulation layer for encapsulation in the display panel. FIG. 5 is another schematic cross-sectional view of a second non-display region according to an embodiment of the present disclosure. As shown in FIG. 5, the carrier layer 4 can include a first inorganic encapsulation layer 71, and the organic layer 3 can include an organic encapsulation layer 70. The display panel further includes a second inorganic encapsulation layer 72 located on a side of the organic layer 3 facing away from the first inorganic encapsulation layer 71. The laminated structure formed by the first inorganic encapsulation layer 71, the organic encapsulation layer 70 and the second inorganic encapsulation layer 72 can be used as a thin-film encapsulation layer 7 to encapsulate the light-emitting unit 22. In an embodiment, the first groove 51 are provided in the first inorganic encapsulation layer 71, which can ensure the reliability of the light-emitting unit 22 and the flatness of the organic encapsulation layer 70 formed by the organic layer 3.

In an embodiment, the first recess 51 can be provided in the first inorganic encapsulation layer 71 located only in the second display region AA2, and the first recess 51 is not provided in the first inorganic encapsulation layer 71 located in the first display region AA1.

Figure 6:
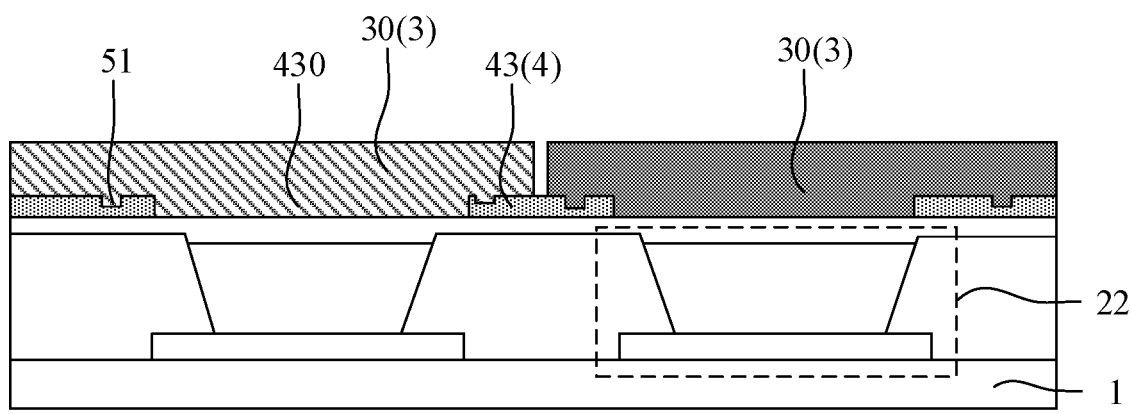
FIG. 6 is another schematic cross-sectional view of a second non-display region according to an embodiment of the present disclosure.

FIG. 6 is another schematic cross-sectional view of a second non-display region according to an embodiment of the present disclosure. As shown in FIG. 6, the carrier layer 4 includes a black matrix 43 including an opening 430. The organic layer 3 includes a plurality of organic sub-layers 30 emitting light of different colors. The color of the organic sub-layer 30 is the color of the light emitted from the organic sub-layer 30. In FIG. 6, different filling patterns are used to illustrate the organic sub-layers 30 emitting light of different colors. As shown in FIG. 6, the organic sub-layer 30 is at least partially located in the opening 430 of the black matrix 43. The organic sub-layer 30 and a corresponding light-emitting unit 22 at least partially overlap along the normal direction of the substrate 1, and the color of the organic sub-layer 30 is the same as the color of light emitted by the corresponding light-emitting unit 22. With such configuration, the organic sub-layer 30 can function as a filter, which is equivalent to reusing the organic sub-layer 30 as a color filter.

As shown in FIG. 6, the black matrix 43 includes the first groove 51. The organic sub-layer 30 is at least partially located in the first groove 51. The opening 430 corresponds to the light-emitting unit 22. The first groove 51 is located between the two openings 430.

When manufacturing the display panel with the structure shown in FIG. 6, after forming the light-emitting unit 22, firstly, the black matrix 43 is made of a material with a lower light transmittance. The black matrix 43 includes the opening 430 and the first groove 51. The opening 430 and the first groove 51 can be formed in the same process. In an embodiment, a half-gray-scale mask can be used to expose the black matrix 43 to obtain openings 430 and first grooves 51 that have different depths. The regions of the half-gray-scale mask with different transmittances are provided with openings 430 and first grooves 51. After the preparation of the black matrix 43 is completed, in an embodiment, a plurality of organic sub-layers 30 can be formed by a material with a certain light-emitting color on the side of the black matrix 43 facing away from the substrate 1. The corresponding opening 430 and the first groove 51 are filled in the organic sub-layer 30. The preparation of the organic sub-layer 30 can be formed by a process such as inkjet printing.

It should be noted that, in some embodiments, the number of the organic layer 3 and the number of the carrier layer 4 each can be one. In an embodiment of the present disclosure, at least two organic layers 3 and at least two carrier layers 4 can be provided in the display panel. In an embodiment of the present disclosure, when the display panel includes at least two organic layers 3 and at least two carrier layers 4, one of the at least two organic layers can be used as the organic encapsulation layer, and one of the at least two carrier layers that is in contact with this organic layer is used as the inorganic encapsulation layer. A refractive index of another one of the at least two organic layers is larger, and the refractive index of the carrier layer in contact with the organic layer is smaller. Moreover, in addition to the first grooves, openings with inclined sidewalls can also be provided in the carrier layer with a smaller refractive index, and the organic layer is in contact with the inclined sidewalls so that the organic layer with a higher refractive index and the carrier layer with a lower refractive index cooperate with each other to form a micro lens pattern.

In an embodiment, the first groove can be implemented in many forms, which will be described in the following.

In an embodiment, as shown in FIG. 2, the first groove 51 can include a first sub-groove 511 surrounding the first display region AA1. The first sub-groove 511 is illustrated as an annular groove. With such configuration, it is possible to planarize multiple locations of the organic layer 3 that are likely to accumulate and form bulges, to ensure the flatness of the organic layer 3 at these locations, and to reduce the width of a plurality of non-display regions located at different positions, such as the first non-display sub-region NA1 and the second non-display sub-region NA2, the third non-display sub-region NA3, and the fourth non-display sub-region NA4.

Figure 7:
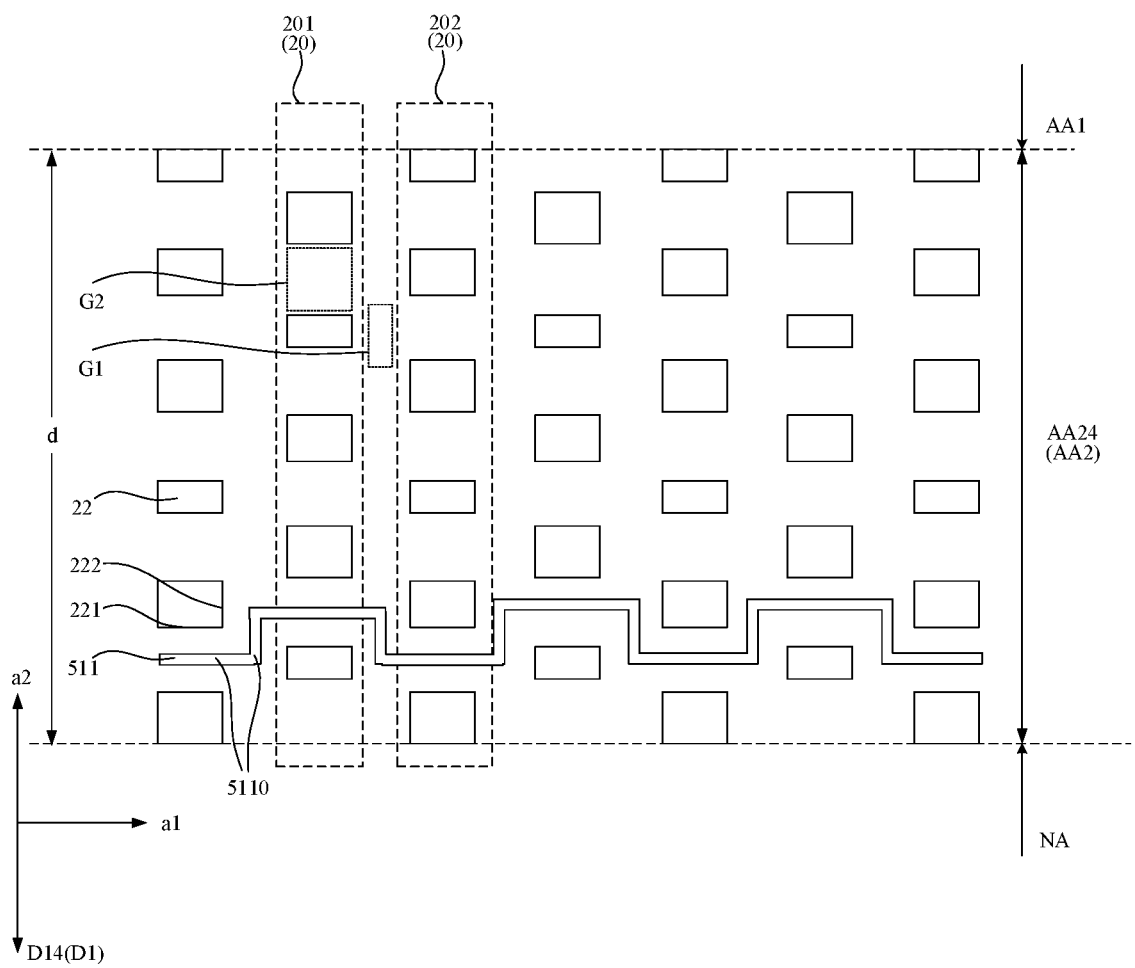
FIG. 7 is an enlarged schematic diagram of a second display region according to an embodiment of the present disclosure.

FIG. 7 is an enlarged schematic view of a second display region in an embodiment of the present disclosure. When the first sub-groove 511 having a ring shape is provided, for example, as shown in FIG. 7, an orthographic projection of the first sub-groove 511 on a plane of the display panel can include multiple sub-segments 5110 that are connected end to end. In an embodiment, an extending direction of an orthographic projection of two adjacent sub-segments 5110 on the plane of the display panel can be adjusted according to an arrangement rule of the light-emitting units 22. As shown in FIG. 7, in an embodiment, an orthographic projection of at least a part of the sub-segment 5110 on the plane of the display panel is located between two adjacent light-emitting units 22. Distances between an orthographic projection of the sub-segment 5110 on the plane of the display panel and two light-emitting units 22 located on both sides of the sub-segment 5110 are equal to each other, so as to prevent light emitted from the light-emitting unit 22 from being affected by the process error caused when forming the first sub-groove 511. It should be noted that the distances equal to each other refer to the distances that are substantially equal to each other within an allowable error range.

In an embodiment, the light-emitting units 22 can be arranged in various forms. As shown in FIG. 7, the light-emitting unit 22 can be arranged in a plurality of light-emitting unit rows 20. Each light-emitting unit column 20 includes a plurality of light-emitting units 22. A first gap G1 is formed between two adjacent light-emitting unit columns 20, and a second gap G2 is formed between two adjacent light-emitting units 22 in a same light-emitting unit column 20. The arrangement direction a1 of the light emitting unit columns 20 and an extending direction a2 of the light emitting unit column 20 intersect with each other, for example, by being perpendicular to each other. In an embodiment, with reference to FIG. 2, the arrangement direction a1 of the light-emitting unit columns 20 can be parallel to an extending direction of a second edge S2 of the display panel. The extending direction a2 of the light emitting unit column 20 can be parallel to an extending direction of a first edge S1 of the display panel.

As shown in FIG. 7, the light-emitting unit columns 20 include a first light-emitting unit column 201 and a second light-emitting unit column 202 that are adjacent to each other. The first light-emitting unit columns 201 and the second light-emitting unit columns 202 are alternatively arranged in the arrangement direction a1 of the light-emitting unit columns 20. In an embodiment of the present disclosure, the second gap G2 formed between two adjacent light-emitting units 22 located in the first light-emitting unit row 201 can overlap with the light-emitting units 22 in the second light-emitting unit column 202 in the arrangement direction a1.

Based on the light-emitting units 22 having the arrangement as shown in FIG. 7, in an embodiment, the extending directions of two adjacent sub-segments 5110 can intersect with each other. As shown in FIG. 7, two adjacent sub-segments 5110 can be perpendicular to each other. The first sub-grooves 511 located in a same display sub-region have a shape similar to a shape of a Chinese character "几".

Figure 8:
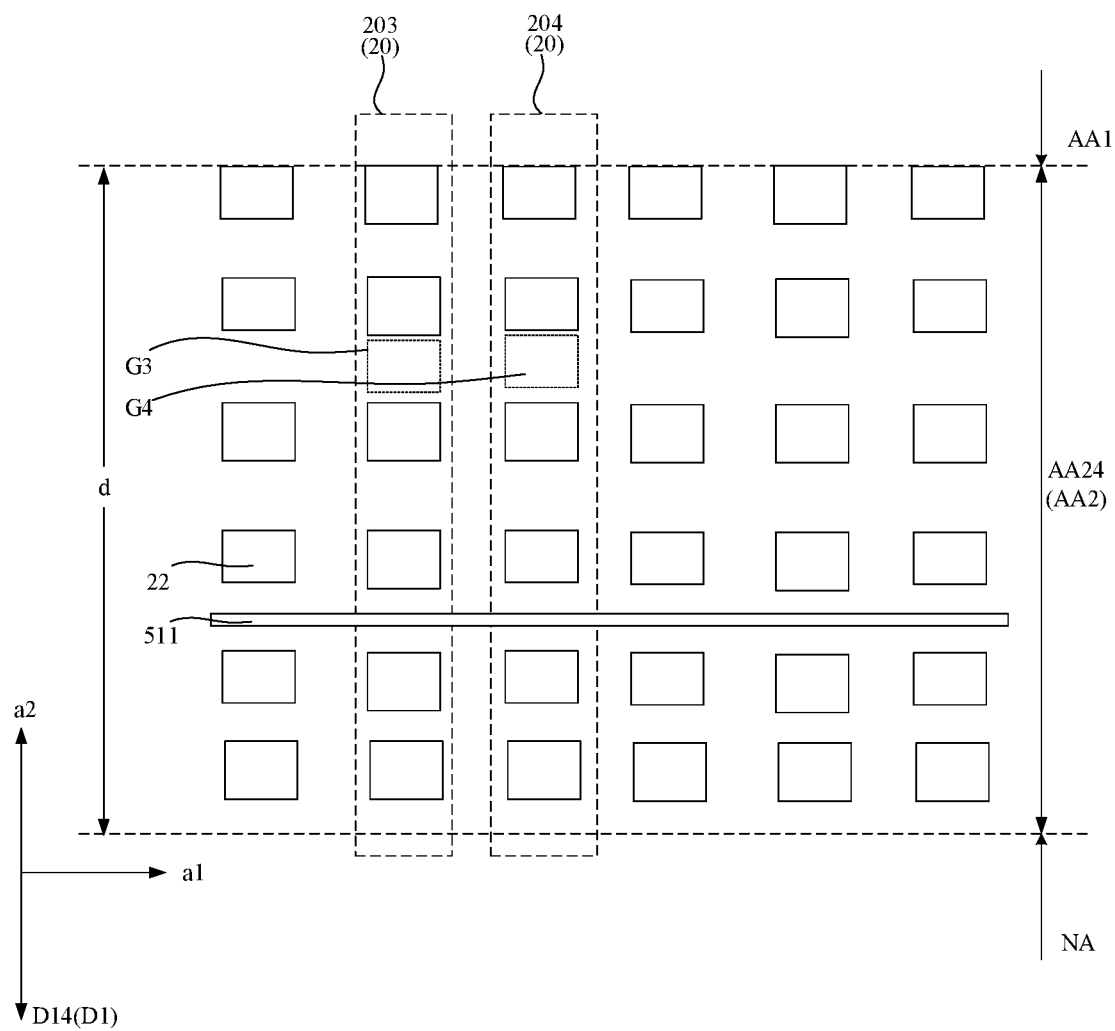
FIG. 8 is another enlarged schematic diagram of a second display region according to an embodiment of the present disclosure.

FIG. 8 is another enlarged schematic diagram of a second display region in an embodiment of the present disclosure. In an embodiment, as shown in FIG. 8, the light-emitting unit columns 20 includes a third light-emitting unit column 203 and a fourth light-emitting unit column 204. A third gap G3 is formed between two adjacent light-emitting units 22 in the third light-emitting unit column 203. A fourth gap G4 is formed between two adjacent light-emitting units 22 in the fourth light-emitting unit column 204. The third gap G3 and the fourth gap G4 at least partially overlap in the arrangement direction a1 of the light-emitting unit columns.

Based on the light-emitting units 22 having the arrangement rule as shown in FIG. 8, in an embodiment, the first sub-groove 511 is arranged as a straight line segment, that is, the first sub-groove 511 extends without corners in a single display sub-region.

As shown in FIG. 8, the third light-emitting unit column 203 and the fourth light-emitting unit column 204 can be aligned with each other along the arrangement direction a1 of the light-emitting unit columns 20.

In an embodiment, for two adjacent light-emitting units 22 located in a same light-emitting unit column 20, two adjacent edges of the two light-emitting units 22 are parallel to each other, and the extending direction of each sub-segment 5110 of the first sub-groove 511 is the same as an extending direction of an edge of the light-emitting unit 22 adjacent to the sub-segment 5110.

In an embodiment of the present disclosure, an orthographic projection of the light-emitting unit 22 on the plane of the display panel can have a shape of quadrilateral. As shown in FIG. 7, the light emitting unit 22 includes a first edge 221 and a second edge 222, an extending direction of the sub-segment 5110 close to the first edge 221 is parallel to an extending direction of the first edge 221, and an extending direction of the sub-segment 5110 close to the second edge 222 is parallel to an extending direction of the second edge 222.

As shown in FIG. 7, when the first edge 221 and the second edge 222 are perpendicular to each other, the extending directions of two adjacent sub-segments 5110 in the first sub-groove 511 are also perpendicular to each other.

Exemplarily, as shown in FIG. 2 and FIG. 7, the extending direction of the first edge 221 and the arrangement direction a1 of the light-emitting unit rows 20 are parallel to the extending direction of the second edge S2 of the display panel.

Figure 9:
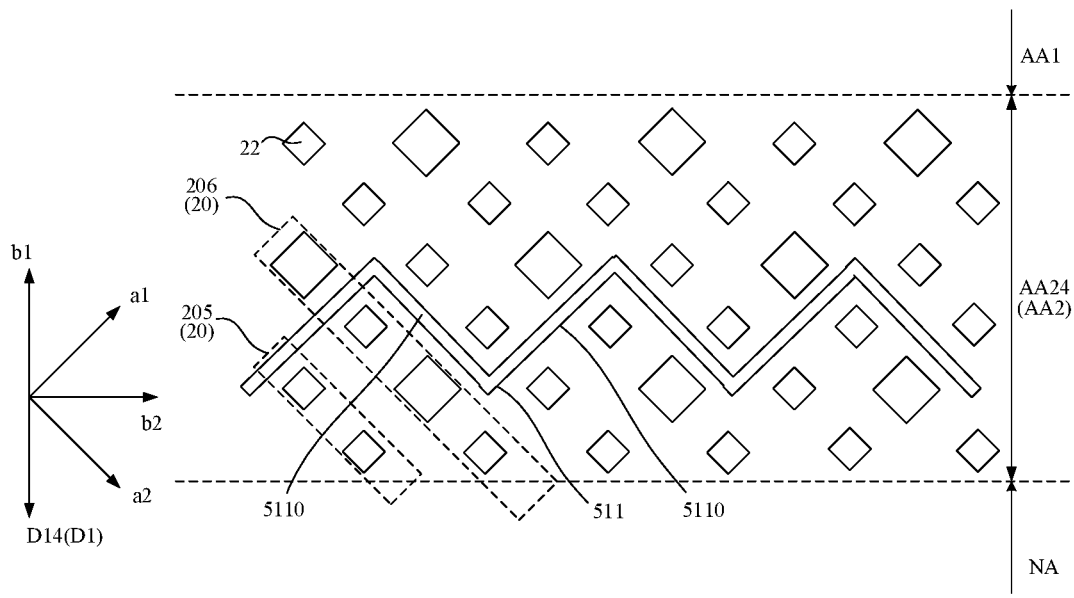
FIG. 9 is another enlarged schematic diagram of a second display region according to an embodiment of the present disclosure.

FIG. 9 is another enlarged schematic diagram of a second display region in an embodiment of the present disclosure. In an embodiment, with reference to FIG. 2 and FIG. 9, an acute angle is formed between the arrangement direction a1 of the light-emitting unit columns 20 and the extending direction b2 of the second edge S2 of the display panel. Based on the light-emitting units 22 having the arrangement pattern shown in FIG. 9, an acute angle is formed between the orthographic projection of each sub-segment 5110 in the first sub-groove 511 on the plane of the display panel and each of the first edge S1 and the second edge S2 of the display panel, that is, the first sub-grooves 511 located in a same display sub-region have a sawtooth-like shape.

It should be noted that the shape of the light-emitting unit 22 shown in FIG. 7, FIG. 8 and FIG. 9 is only a schematic diagram. The orthographic projection of the light-emitting unit 22 on the plane of the display panel may have a shape having an arc-shaped edge. For example, when the shape of the orthographic projection of the unit 22 on the plane of the display panel is circular, the orthographic projection of the first sub-groove 511 on the plane of the display panel can have a shape of an arc having a same curvature as the edge of the light-emitting unit 22.

In an embodiment, the number of the first sub-groove 511 can be one. FIG. 7, FIG. 8, and FIG. 9 are schematic diagrams of providing one first sub-groove 51 in the second display region AA2.

In an embodiment, the number of the first sub-grooves 511 is greater than or equal to two. When a plurality of first sub-grooves 511 are provided, the plurality of first sub-grooves 511 is arranged along the corresponding first direction D1, and the first direction is a direction from a center of the display region AA points to the non-display region NA. According to the different locations of the first sub-grooves 511, the first direction D1 can include the first sub-direction D11, the second sub-direction D12, the third sub-direction D13, and the fourth sub-direction D14.

Figure 10:
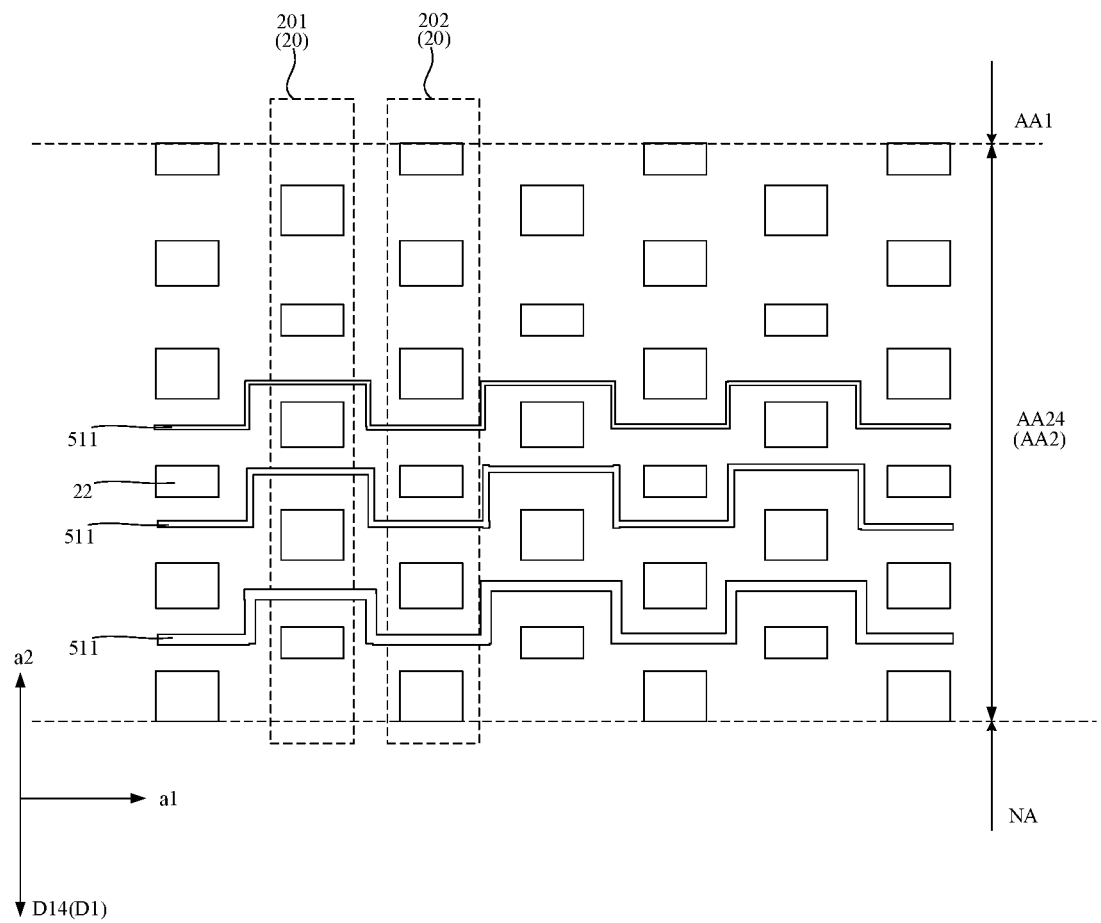
FIG. 10 is another enlarged schematic diagram of a second display region according to an embodiment of the present disclosure.

FIG. 10 is another enlarged schematic view of a second display region in an embodiment of the present disclosure. As shown in FIG. 10, a plurality of first sub-grooves 511 is arranged along the corresponding first direction D1. If a large amount of accumulation is formed at the organic layer 3 in the second display region AA2, when a volume of the organic layer 3 contained in one first sub-groove 511 is constant, a plurality of first sub-groove 511 is provided and can accommodate more organic layers 3 that would otherwise accumulate to generate bulges, thus improving the surface flatness of the organic layer 3 located on the carrier layer 4.

When the first sub-grooves 511 are provided, in an embodiment, the first sub-grooves 511 have volume gradually increasing along the corresponding first direction D1, so as to make the volume of the organic layer 3 that is accommodated in the first sub-grooves 511 along the corresponding first direction D1 match the volume of the organic layer 3 that accumulates at various positions during its flowing process. In this way, the flatness of the surface of the organic layer 3 facing away from the carrier layer 4 is improved, and it is possible to avoid to form a recessed structure on the surface of the organic layer 3 facing away from the substrate 1 caused by the first sub-groove 511 with a large volume in certain positions where a small amount of the organic layer is accumulated, and to avoid bulges formed on the surface of the organic layer 3 facing away from the substrate 1 at some places where a large amount of the organic layer 3 is provided in the first sub-groove 511 with a small volume.

In order to set the volumes of the first sub-grooves 511 according to the above-mentioned rule, the first sub-grooves 511 have depths gradually increasing along the corresponding first direction D1 and/or widths gradually increasing along the corresponding first direction D1.

As shown in FIG. 3, three first sub-grooves 511 of the first groove 51 are taken as an example. The depths of the first sub-grooves 511 gradually increase along the corresponding first direction D1, and a depth direction of the first sub-groove 511 is parallel to the normal direction of the display panel.

As shown in FIG. 10, when three first sub-grooves 511 in the first groove 51 are taken as an example, the widths of the first sub-grooves 511 gradually increase along the corresponding first direction D1.

In an embodiment, when multiple first sub-grooves 511 are provided, the multiple first sub-recesses 511 are arranged such that arrangement density of the sub-grooves 511 gradually increases along the corresponding first direction D1. The arrangement density of the first sub-grooves 511 can be understood as an area of the first sub-grooves 511 provided within a unit area in the second display region AA2.

Figure 11:
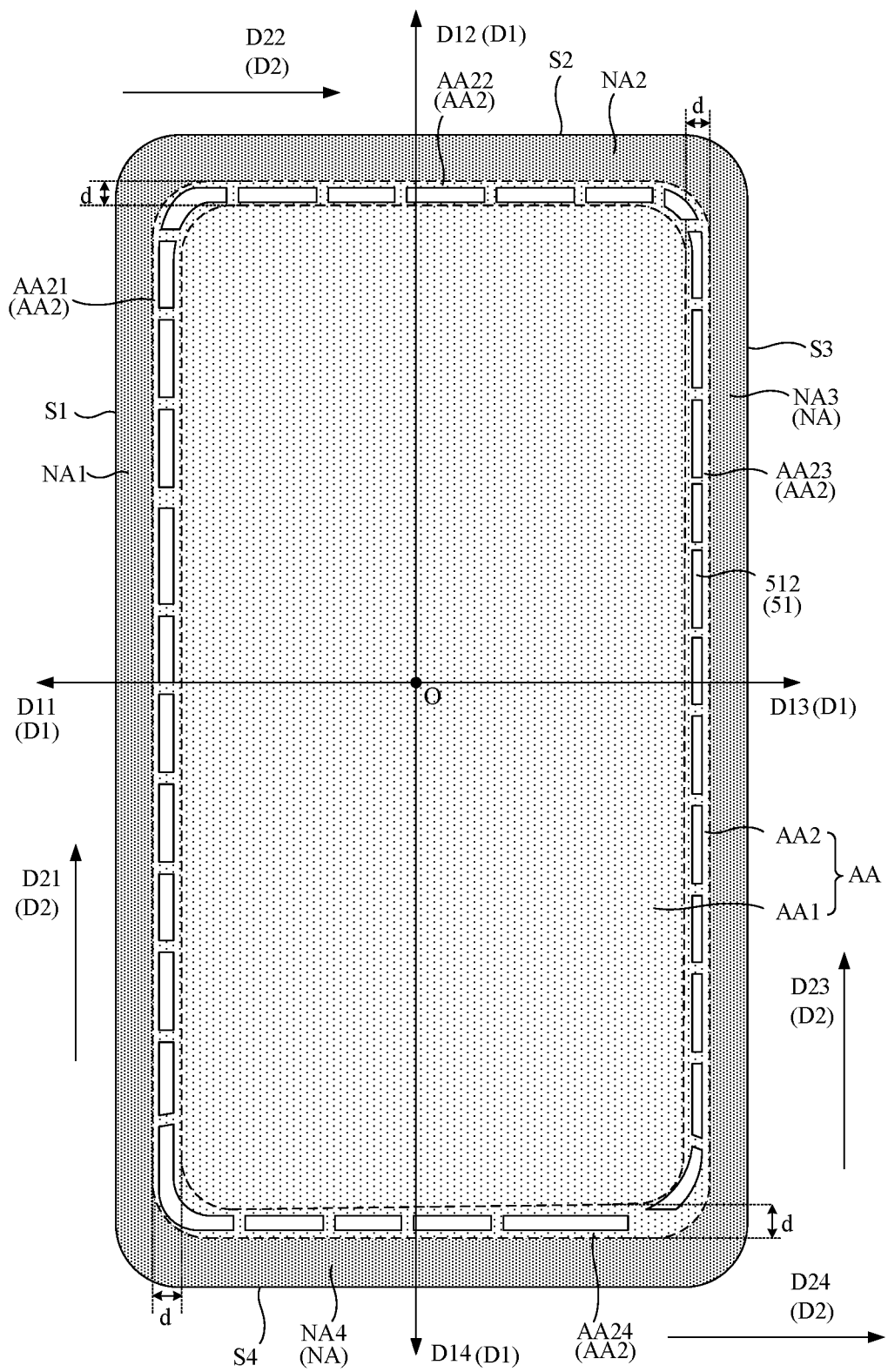
FIG. 11 is another schematic top view of a display panel according to an embodiment of the present disclosure.

FIG. 11 is another schematic top view of a display panel according to an embodiment of the present disclosure. In an embodiment of the present disclosure, as shown in FIG. 11, a plurality of second sub-grooves 512 can also be provided in the first groove 51 and can surround the first display region AA1. As shown in FIG. 11, a distance is assured between two adjacent second sub-grooves 512, that is, multiple second sub-grooves 512 are spaced apart from each other.

Figure 12:
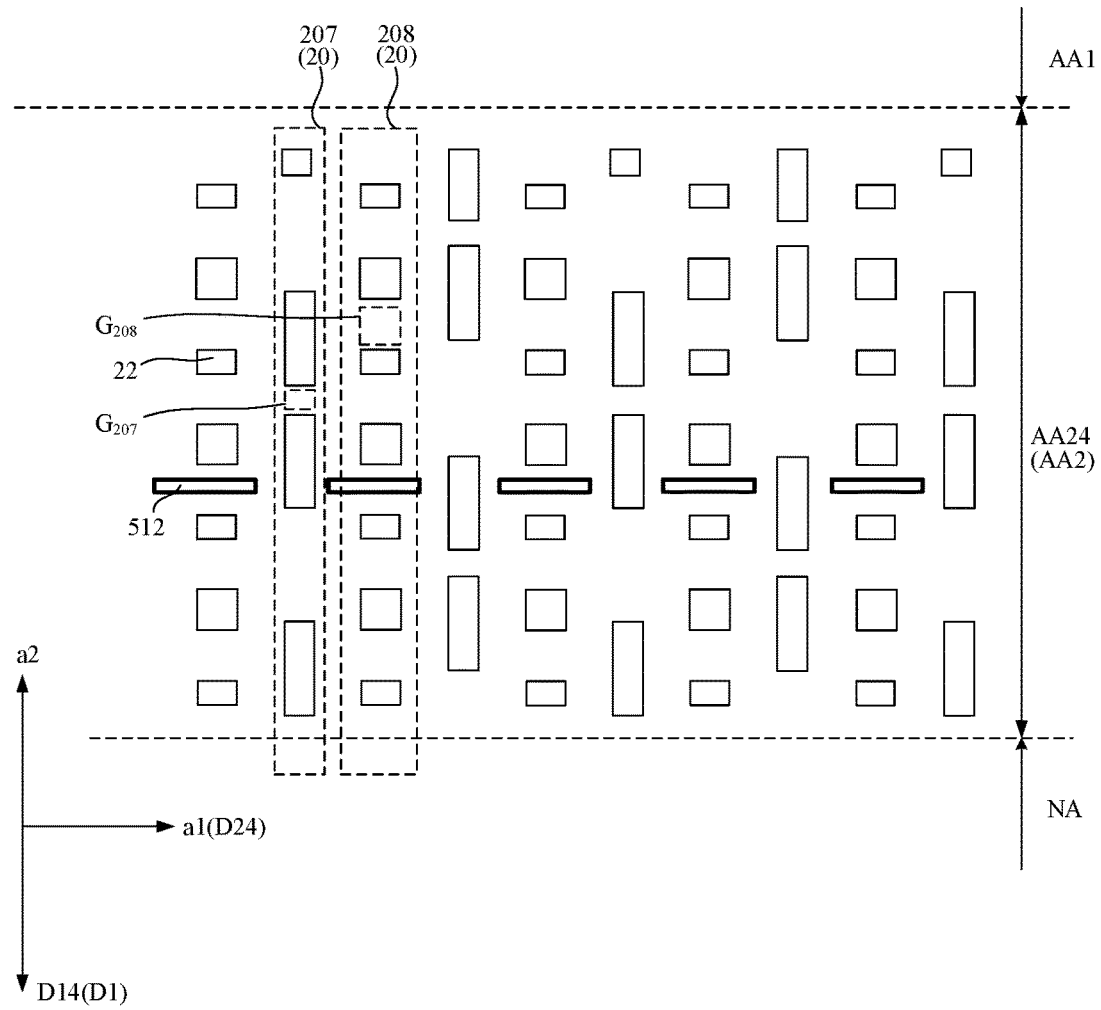
FIG. 12 is another enlarged schematic diagram of a second display region according to an embodiment of the present disclosure.

FIG. 12 is another enlarged schematic view of a second display region in an embodiment of the present disclosure. As shown in FIG. 12, the display panel includes a seventh light-emitting unit column 207 and an eighth light-emitting unit column 208. A gap $G_{207}$ formed between two adjacent light-emitting units 22 in the seventh light-emitting unit column 207 is smaller than a gap $G_{208}$ formed between two adjacent light-emitting units 22 in the eighth light-emitting unit column 208. An orthographic projection of the second sub-groove 512 on the plane of the display panel is located between two adjacent light-emitting units 22 located in the eighth light-emitting unit column 208 with a larger gap. No second sub-groove 512 is provided between two adjacent light-emitting units 22 located in the seventh light-emitting unit column 207 with a smaller gap. The second sub-groove 512 is arranged away from a position where a distance between the light units 22 is small, so that there is a distance between two adjacent second sub-grooves 512, which is beneficial to simplify preparation of the second sub-groove 512.

In an embodiment, some second sub-grooves 512 are arranged along a second direction D2 intersecting the first direction.

As described above, the first direction D1 can include multiple directions according to the positions where the second sub-grooves 512 are located. The corresponding second direction D2 can also include multiple directions.

As shown in FIG. 11, the second direction D2 includes a fifth sub-direction D21, a sixth sub-direction D22, a seventh sub-direction D23, and an eighth sub-direction D24. The second sub-grooves 512 located in the first display sub-region AA21 are arranged along the fifth sub-direction D21. The second sub-grooves 512 located in the second display sub-region AA22 are arranged along the sixth sub-direction D22, and the second sub-grooves 512 located in the third display sub-region AA23 are arranged along the seventh sub-direction D23, and the second sub-grooves 512 located in the fourth display sub-region AA24 are arranged along the eighth sub-direction D24.

In an embodiment, the second direction D2 can be perpendicular to the corresponding first direction D1. For example, as shown in FIG. 11, the fifth sub-direction D21 can be perpendicular to the first sub-direction D11. The sixth sub-direction D22 can be perpendicular to the second sub-direction D12. The seventh sub-direction D23 can be perpendicular to the third sub-direction D13. The eighth sub-direction D24 can be perpendicular to the fourth sub-direction D14.

Figure 13:
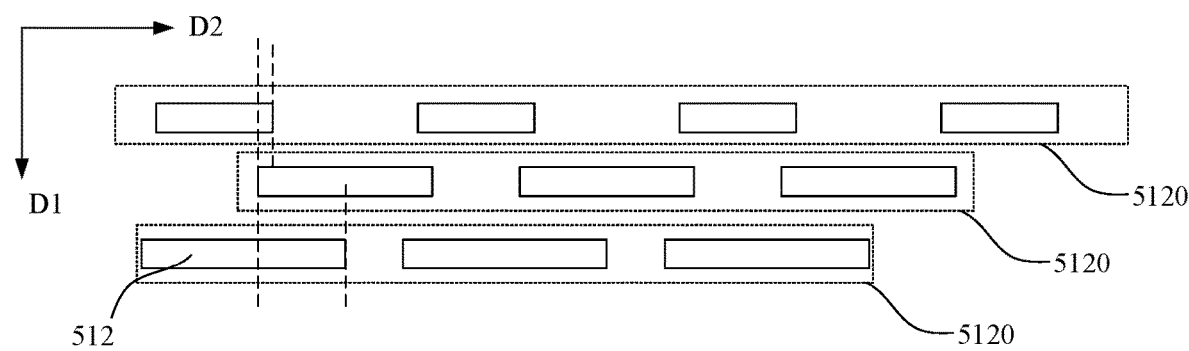
FIG. 13 is another enlarged schematic diagram of a second display region according to an embodiment of the present disclosure.

FIG. 13 is another enlarged schematic view of a second display region in an embodiment of the present disclosure. In an embodiment, as shown in FIG. 13, a plurality of second sub-grooves 512 is arranged to form a second sub-grooves group 5120 along the second direction D2. The second sub-grooves 512 in a same second sub-groove group 5120 do not overlap with each other along the first direction D1, that is, there is a distance formed between the second sub-grooves 512 in the same second sub-groove group 5120 in the first direction D1.

The display panel can include a plurality of second sub-groove groups 5120 arranged along the corresponding first direction D1. The arrangement of the plurality of second sub-groove groups 5120 can improve the surface flatness of the organic layer 3 located above the carrier layer 4. If the amount of the organic layer 3 accumulated in the second display region AA2 is relatively large, when the volume of the organic layer 3 contained in a second sub-groove group 5120 is constant, multiple second sub-grooves groups 5120 can be provided to accommodate more organic layers 3 that are likely to accumulate to form the bulges, therefore improving the surface flatness of the organic layer 3 above the carrier layer 4.

As shown in FIG. 13, two adjacent second sub-groove groups 5120 overlap along the first direction D1, that is, two adjacent second sub-groove groups 5120 have overlapping portions along the first direction D1. At the position of the overlapping part, it is equivalent to providing two groove structures for promoting the flattening of the organic layer 3, which is beneficial to improve the flatness of the plane of the organic layer 3 away from the substrate 1.

In an embodiment, the number of the second sub-groove groups 5120 can be greater than or equal to three. As shown in FIG. 13, three second sub-groove groups 5120 are exemplarily illustrated. Areas of overlapping portions gradually increase along the first direction D1. With such configuration, along the corresponding first direction D1, the volume of the organic layer 3 that can be accommodated in the second sub-grooves 512 matches the accumulation amount of the organic layer 3 at various positions during its flowing process after printing.

When arranging the second sub-grooves 512 along the first direction D1, the volumes of the second sub-grooves 512 gradually increase along the corresponding first direction D1, so that along the corresponding first direction D1, the volume of the organic layer 3 that can be accommodated in the second sub-grooves 512 matches the accumulation amount of the organic layer 3 at various positions during its flow process after printing.

In an embodiment, in order to set the volumes of the second sub-grooves 512 according to the above-mentioned rule, the depths of the second sub-groove 512 can gradually increase along the first direction D1, where the depth direction of the second sub-groove 512 is parallel to the normal direction of the display panel; and/or the widths of the second sub-grooves 512 can gradually increase along the corresponding first direction D1, and the width of the second sub-groove 512 is parallel to the first direction D1.

Figure 14:
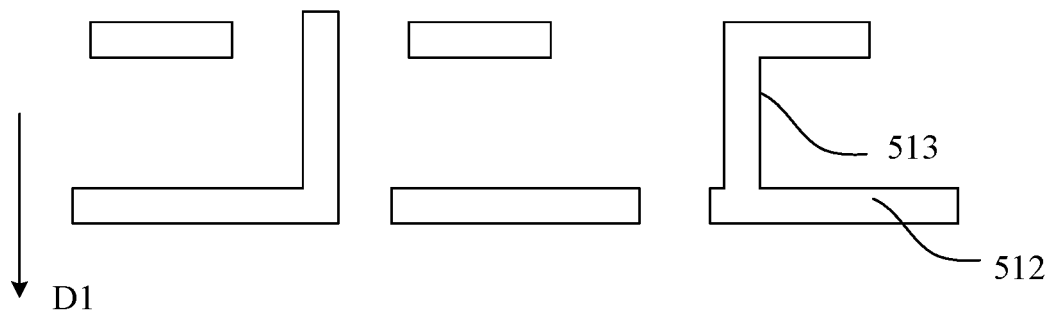
FIG. 14 is another enlarged schematic diagram of a second display region according to an embodiment of the present disclosure.

In an embodiment, the first groove provided in an embodiment of the present disclosure further includes at least one third sub-groove 513. FIG. 14 is another enlarged schematic view of a second display region in an embodiment of the present disclosure. As shown in FIG. 14, the extending direction of the third sub-groove 513 is different from the extending direction of the second sub-groove 512. The arrangement of the third sub-groove 513 can guide the organic layer 3 to improve the flatness of the surface of the organic layer 3 facing away from the carrier layer 4.

As shown in FIG. 14, in an embodiment, the third sub-groove 513 can extend along the first direction D1 at the corresponding position.

In an embodiment, as shown in FIG. 14, at least one third sub-groove 513 communicates with the second sub-groove 512 so that more organic layers 3 can be accommodated.

When arranging the third sub-grooves 513, the widths of the third sub-grooves 513 gradually increase along the corresponding first direction D1, and the width direction of the third sub-groove 513 is perpendicular to its extending direction; and/or, the depths of the third sub-grooves 513 gradually increase along the first direction. In the corresponding first direction D1, the volume of the organic layer 3 that can be accommodated in the third sub-grooves 513 matches the accumulation amount of the organic layer 3 at various positions during its flowing process after printing.

Figure 15:
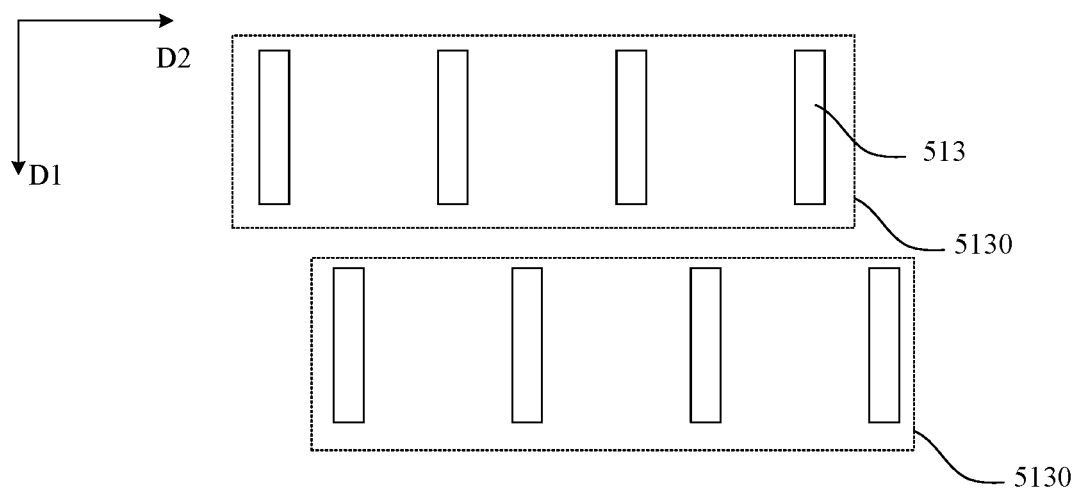
FIG. 15 is another enlarged schematic diagram of a second display region according to an embodiment of the present disclosure.

FIG. 15 is another enlarged schematic view of a second display region in an embodiment of the present disclosure. As shown in FIG. 15, the first groove 51 includes a plurality of third sub-grooves 513 arranged along the corresponding second direction D2 to form a third sub-groove group 5130. As shown in FIG. 15, the number of the above-mentioned third sub-groove group 5130 is greater than or equal to two, and two adjacent third sub-groove groups 5130 are arranged along the corresponding first direction D1, and do not overlap with each other along the corresponding first direction D1 (that is, the closest two third sub-grooves 513 in the two adjacent third sub-groove groups 5130 do not overlap with each other along the corresponding first direction D1). Such configuration is equivalent to arranging the third sub-grooves 513 at intervals on the flowing path of the organic layer 3.

Figure 16:
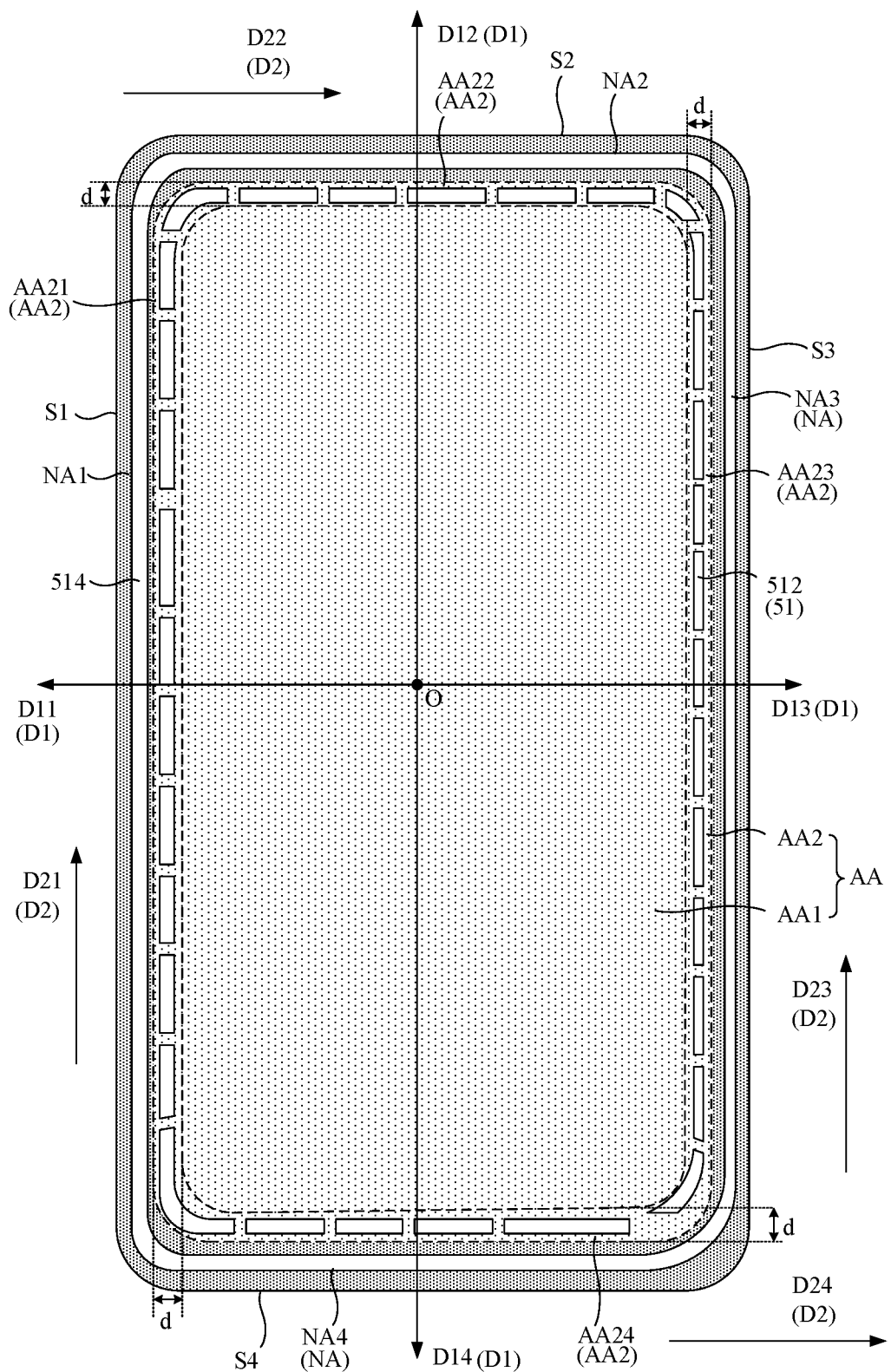
FIG. 16 is another schematic top view of a display panel according to an embodiment of the present disclosure.

FIG. 16 is another schematic top view of a display panel according to an embodiment of the present disclosure. In an embodiment, as shown in FIG. 16, the carrier layer 4 further includes at least one fourth sub-groove 514 located in the non-display region NA. The fourth sub-groove 514 is an annular groove and surrounds the second display region AA2, which can shorten the length of the climbing region.

In an embodiment, the fourth sub-grooves 514 can be arranged in a manner similar to the second sub-grooves 512, that is, the fourth sub-grooves 514 has a discontinuous structure.

In an embodiment of the present disclosure, multiple fourth sub-grooves 514 can be provided in the carrier layer 4 and arranged along the corresponding first direction D1.

When arranging multiple fourth sub-grooves 514 along the first direction D1, the volumes of the fourth sub-grooves 514 can be gradually reduced along the corresponding first direction D1, so that along the corresponding first direction D1, the volume of the organic layer 3 that can be accommodated in the fourth sub-groove 514 matches the accumulation amount of the organic layer 3 at various positions during its flowing process after printing.

In order to set the volumes of the fourth sub-grooves 514 according to the above-mentioned rule along the corresponding first direction, the widths of the fourth sub-grooves 514 can be gradually reduced along the corresponding first direction D1, where the width direction of the fourth sub-groove 514 is parallel to the corresponding first direction D1; and/or, the depths of the fourth sub-grooves can be gradually reduced.

Exemplarily, when arranging multiple fourth sub-grooves 514 in the carrier layer 4, the fourth sub-grooves 514 can be arranged in a density gradually reducing along the first direction D1.

In an embodiment, the total width n of the region where the fourth sub-grooves 514 are located satisfies 2 mm≤n≤3 mm, and the width direction of the region where the fourth sub-grooves 514 are located is the first direction.

Figure 17:
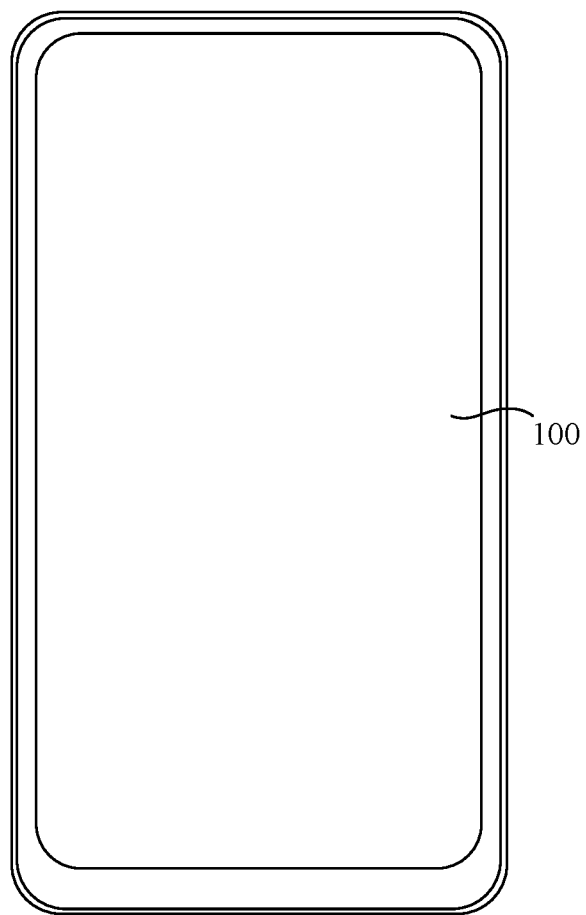
FIG. 17 is a schematic diagram of a display device according to an embodiment of the present disclosure.

An embodiment of the present disclosure also provides a display device. FIG. 17 is a schematic diagram of a display device according to an embodiment of the present disclosure. As shown in FIG. 17, the display device includes the above display panel 100. The specific structure of the display panel 100 has been described in detail in the above embodiments, and will not be repeated herein. The display device shown in FIG. 17 is only for schematic illustration, and the display device can be any electronic device with a display function, such as a mobile phone, a tablet computer, a laptop computer, an e-book, or a television. The display device includes the above display panel.

In the display device according to embodiments of the present disclosure, the first groove is provided in the carrier layer of the display panel, and the first groove is arranged in the second display region where the organic layer is likely to accumulate, and in the subsequent process where the organic layer is prepared by printing and other processes, the organic layer that is initially in a liquid state, can flow into the first groove of the carrier layer. That is, the first groove can accommodate at least part of the organic layer, and it is avoided that the organic layer forms bulges at positions where the organic layer is likely to accumulate, which can improve the flatness of the surface of the organic layer facing away from the carrier layer, and can also shorten the length of the organic layer located in the climbing region of the non-display region, and thus is conducive to narrowing the frame width of the display panel.

The above-described embodiments are merely some embodiments of the present disclosure and are not intended to limit the present disclosure. Any modifications, equivalent substitutions and improvements made within the principle of the present disclosure shall fall into the protection scope of the present disclosure.

What is claimed is:

1. A display panel, comprising:
a substrate having a display region and a non-display region;
light-emitting units arranged in the display region and located on a side of the substrate;
an organic layer arranged in the display region and located on a side of the light-emitting units facing away from the substrate; and
a carrier layer at least partially arranged in the display region and located between the organic layer and the light-emitting units and in contact with the organic layer,
wherein the display region comprises a first display region and a second display region, and the second display region is located between the first display region and the non-display region, and
wherein the carrier layer comprises at least one first groove in the second display region, a projection of the organic layer on the carrier layer covers the at least one first groove, and the at least one first groove overlaps with none of the light-emitting units in a normal direction of the substrate.

2. The display panel of claim 1, wherein the at least one first groove comprises at least one first sub-groove, and wherein each of the at least one first sub-groove is an annular groove that surrounds the first display region.

3. The display panel of claim 2, wherein the at least one sub-groove comprises a plurality of first sub-grooves, wherein each of the plurality of first sub-grooves has a depth gradually increasing at least along a first direction or a width gradually increasing along the first direction, and the first direction is a direction from a center of the display region pointing to the non-display region.

4. The display panel of claim 2, wherein the at least one first groove comprises a plurality of first sub-grooves, wherein the plurality of first sub-grooves is arranged in a density gradually increasing along a first direction, and wherein the first direction is a direction from a center of the display region pointing to the non-display region.

5. The display panel of claim 1, wherein the at least one first groove comprises a plurality of second sub-grooves surrounding the first display region and spaced apart from each other, at least two of the plurality of second sub-grooves are arranged along a second direction intersecting with a first direction, and the first direction is a direction from a center of the display region pointing to the non-display region.

6. The display panel of claim 5, wherein at least two second sub-grooves of the plurality of second sub-grooves are arranged along the second direction to form one of a plurality of second sub-groove groups and do not overlap in the first direction; and two adjacent second sub-groove groups of the plurality of second sub-groove groups overlap with each other in the first direction to form an overlapping portion.

7. The display panel of claim 6, wherein a number of the plurality of second sub-groove groups is greater than or equal to three, and areas of the overlapping portions of the plurality of second sub-groove groups gradually increase along the first direction.

8. The display panel of claim 6, wherein each of the plurality of second sub-grooves has a depth gradually increasing at least along the first direction or a width gradually increasing along the first direction.

9. The display panel of claim 5, wherein the at least one first groove further comprises at least one third sub-groove, and each of the at least one third sub-groove extends along the first direction.

10. The display panel of claim 9, wherein one of the at least one third sub-groove communicates with one of the plurality of second sub-grooves.

11. The display panel of claim 9, wherein at least one of a width or a depth of the at least one third sub-groove gradually increases along the first direction.

12. The display panel of claim 9, wherein the at least one third sub-groove comprises a plurality of third sub-grooves, and at least two of the plurality of third sub-grooves are arranged along the second direction to form one of a plurality of third sub-groove groups.

13. The display panel of claim 12, wherein a number of the plurality of third sub-groove groups is greater than or equal to two, and two adjacent third sub-groove groups of the plurality of third sub-groove groups are arranged along the first direction and do not overlap in the first direction.

14. The display panel of claim 1, wherein the carrier layer further comprises at least one fourth sub-groove located in the non-display region, and each of the at least one fourth sub-groove is an annular groove that surrounds the second display region.

15. The display panel of claim 14, wherein the at least one fourth sub-groove comprises a plurality of fourth sub-grooves, wherein each of the plurality of fourth sub-groove has a width gradually decreasing at least along a first direction or a depth gradually decreasing along the first direction, and the first direction is a direction from a center of the display region pointing to the non-display region.

16. The display panel of claim 14, wherein the at least one fourth sub-groove comprises a plurality of fourth sub-grooves, wherein the plurality of fourth sub-grooves is arranged in a density gradually decreasing along a first direction, and the first direction is a direction from a center of the display region pointing to the non-display region.

17. The display panel of claim 1, wherein the carrier layer comprises a light extraction layer having a refractive index smaller than a refractive index of the organic layer;
wherein the light extraction layer has openings corresponding to the light-emitting units and comprises first side surfaces for forming the openings and first bottom surfaces close to the substrate, wherein each of the first side surfaces intersects with one of the first bottom surfaces and forms an angle $\alpha_1$ with the first bottom surface, where $0<\alpha1<90°$; and each of the first side surfaces is configured to adjust light having large angle of view emitted by one of the light-emitting units to light having small angle of view; and
wherein the openings overlaps with none of the at least one first groove in the normal direction of the substrate.

18. The display panel of claim 1, wherein the carrier layer comprises a first inorganic encapsulation layer, and the display panel further comprises a second inorganic encapsulation layer located on a side of the organic layer facing away from the first inorganic encapsulation layer.

19. The display panel of claim 1, wherein the carrier layer comprises a black matrix, the organic layer comprises organic sub-layers, wherein each of the organic sub-layers at least partially overlaps with one light-emitting unit of the light-emitting units in the normal direction of the substrate, and wherein each of the organic sub-layers has a color same as a color of light emitted by the one light-emitting unit.

20. A display device, comprising a display panel, wherein the display panel comprises:
- a substrate having a display region and a non-display region;
- light-emitting units arranged in the display region and located on a side of the substrate;
- an organic layer arranged in the display region and located on a side of the light-emitting units facing away from the substrate; and
- a carrier layer at least partially arranged in the display region and located between the organic layer and the light-emitting units and in contact with the organic layer,
- wherein the display region comprises a first display region and a second display region, and the second display region is located between the first display region and the non-display region, and
- wherein the carrier layer comprises at least one first groove in the second display region, a projection of the organic layer on the carrier layer covers the at least one first groove, and the at least one first groove overlaps with none of the light-emitting units in a normal direction of the substrate.

* * * * *